United States Patent [19]

Friebe et al.

[11] Patent Number: 5,932,668

[45] Date of Patent: *Aug. 3, 1999

[54] LIQUID ORGANOPOLYSILOXANE RESINS, A PROCESS FOR THEIR PREPARATION, LOW VISCOSITY POLYDIORGANOSILOXANE COMPOSITIONS CONTAINING LIQUID ORGANOPOLYSILOXANE RESINS AND THEIR USE

[75] Inventors: Robert Friebe, Leverkusen; Hubertus Eversheim, Wermelskirchen, both of Germany

[73] Assignee: GE Bayer Silicones GmbH & Co. KG, Erkrath, Germany

[*] Notice: This patent issued on a continued prosecution application filed under 37 CFR 1.53(d), and is subject to the twenty year patent term provisions of 35 U.S.C. 154(a)(2).

[21] Appl. No.: 08/700,896

[22] Filed: Aug. 21, 1996

[30] Foreign Application Priority Data

Aug. 28, 1995 [DE] Germany ............. 195 31 568

[51] Int. Cl.$^6$ ..................................... C08G 77/08
[52] U.S. Cl. .................. 525/478; 528/15; 528/32; 528/31; 524/588; 524/425; 524/493; 524/729; 524/862; 524/847
[58] Field of Search ............. 525/478; 524/588, 524/425, 493, 729, 862, 847; 528/15, 31, 32

[56] References Cited

U.S. PATENT DOCUMENTS

| | | | |
|---|---|---|---|
| 3,284,406 | 11/1966 | Nelson | 260/46.5 |
| 3,436,366 | 4/1969 | Modic | 260/37 |
| 3,884,866 | 5/1975 | Jeram et al. | 260/32.85 B |
| 4,234,713 | 11/1980 | LeGrow | 528/15 |
| 4,293,671 | 10/1981 | Sasaki et al. | 525/478 |
| 4,311,739 | 1/1982 | Hardman et al. | 427/387 |
| 4,500,584 | 2/1985 | Modic | 428/145 |
| 5,077,335 | 12/1991 | Schwabe et al. | 524/474 |
| 5,373,078 | 12/1994 | Juen et al. | 508/15 |

FOREIGN PATENT DOCUMENTS

| | | | |
|---|---|---|---|
| 0108208 | 5/1984 | European Pat. Off. | C08L 83/04 |
| 0195936 | 10/1986 | European Pat. Off. . | |
| 0294277 | 12/1988 | European Pat. Off. . | |
| 0382338 | 8/1990 | European Pat. Off. | C08G 77/50 |
| 0389137 | 9/1990 | European Pat. Off. . | |
| 0389138 | 9/1990 | European Pat. Off. . | |
| 0555050 | 8/1993 | European Pat. Off. | C08G 77/06 |
| 0651021 | 5/1995 | European Pat. Off. | C08L 83/04 |
| 1171614 | 6/1964 | Germany . | |
| 3423770 | 1/1985 | Germany . | |
| 4022661 | 1/1992 | Germany . | |

OTHER PUBLICATIONS

DIN 53504, Determination of tensile strength at break, tensile strength, elongation at break and stress values in a tensile test, pp. 1–5, (Mar. 1985).

DIN 53505, Testing of Elastomers Shore A and D Hardness Testing, pp. 1–4, (Aug. 1973).

DIN 53515, Determination of tear strength of rubber, elastomers and plastic film using Graves angle test piece with nick, pp. 1–3, (Jan. 1990).

International Standard, ISO 34–1979 (E), Rubber, vulcanized—Determination of tear strength (trouser, angle and crescent test pieces), pp. 1—5.

Standard Test Method for Rubber Property—Tear Resistance[1].

T. Ogawa, et al., Synthesis of star–shaped polydimethylsiloxanes containing $SiO_2$ core units, Macromol. Chem. Phys., 195, pp. 1973—1983, (1994).

*Primary Examiner*—Margaret W. Glass
*Attorney, Agent, or Firm*—Sprung Kramer Schaefer & Briscoe

[57] ABSTRACT

Novel liquid organopolysiloxane resins of the average composition $[R^1Si(CH_3)_2O_{1/2}]_a[(CH_3)_3SiO_{1/2}]_b[R^2O_{1/2}]_c[R^1Si(CH_3)O]_d[(CH_3)_2SiO]_e[SiO_2]$, wherein $R^1$ is a $C_2$–$C_8$-alkenyl group, $R^2$ is an optionally substituted, linear or branched $C_1$–$C_8$-alkyl group or a mixture thereof, $a+b+c+d+e$ is about 1 to 6, $d+e$ is about 0 to 3, the resin has a viscosity of 0.1 to 1000 Pas at 25° C., and the alkenyl or vinyl content of the resin is in the range of 0.4 to 4 mmol/g, and their preparation by reacting at least one of tetraalkoxysilane and its partial hydrolyzate with at least one organosiloxane and a strong acid as catalyst in the presence of water and optionally an organic solvent at a temperature of about >40° C. They are formulated into novel low viscosity polydiorganosiloxane compositions.

12 Claims, No Drawings

LIQUID ORGANOPOLYSILOXANE RESINS, A PROCESS FOR THEIR PREPARATION, LOW VISCOSITY POLYDIORGANOSILOXANE COMPOSITIONS CONTAINING LIQUID ORGANOPOLYSILOXANE RESINS AND THEIR USE

The invention relates to liquid organopolysiloxane resins, a process for their preparation, low viscosity polydiorganosiloxane compositions containing liquid organopolysiloxane resins and their use.

The organopolysiloxane resins according to the invention are characterized by a specific proportion of $(R_3SiO_{1/2})$—, $(R_2SiO)$—, $(RO_{1/2})$— and $(SiO_2)$— units.

Low viscosity polydiorganosiloxane compositions according to the invention, containing liquid organopolysiloxane resins according to the invention, can be vulcanized by hydrosilylation reactions at room temperature or at elevated temperatures to give silicone elastomers.

Organopolysiloxane resins with $(R_3SiO_{1/2})$— and $(SiO_2)$— groups are known from the patent literature and have been described in numerous publications. These resins are normally produced by hydrolysis of the corresponding triorganochlorosilanes and tetraalkoxysilanes or their partial hydrolysates in the presence of an aromatic organic solvent such as e.g. xylene or aliphatic hydrocarbons (EP-A-555 050). Methods of preparation are also described which use organosiloxanes with terminal $(R_3SiO_{1/2})$— groups, e.g. hexamethyldisiloxane, and tetraalkoxysilanes (EP-A- 294 277) as starting compounds.

The production of liquid organopolysiloxane resins with $(R_3SiO_{1/2})$—, $(RSiO_{3/2})$— and $(SiO_2)$— units, wherein R represents, inter alia, an aliphatic or aromatic hydrocarbon group is described in EP-A- 389 138.

Furthermore, U.S. Pat. No. 5,373,078 also discloses low viscosity cross-linkable organosiloxane compositions which contain liquid organopolysiloxane resins with $(R_3SiO_{1/2})$— and $(SiO_2)$— units, wherein R represents a $C_1$ to $C_{10}$-alkyl group and the ratio of $(R_3SiO_{1/2})$— to $(SiO_2)$— units is between 1:1 and 2:1. These products, however, are used only to lower the viscosity of the materials and are not incorporated into the elastomer, due to the lack of unsaturated groups.

In the case of a further large group of organopolysiloxane resins with $(CH_2=CH-Si(CH_3)_2O_{1/2})$—, $((CH_3)_3SiO_{1/2})$— and $(SiO_2)$— units, known from the literature, these are solid products at room temperature. Resins of this type are used in a variety of applications.

U.S. Pat. No. 3,884,866, for example, describes the use of this type of resin for the mechanical reinforcement of silicone elastomers. The resins may be incorporated into the network during the course of the hydrosilylation reaction due to the presence of vinyl groups.

DAS 1 171 614 describes silicone resins which contain vinyl groups with a total of 0.6 to 1.0 $(CH_2=CH-Si(CH_3)_2O_{1/2})$— and $((CH_3)_3SiO_{1/2})$— units per $(SiO_2)$— unit and their use in casting compounds.

U.S. Pat. No. 3,284,406 discloses an organopolysiloxane composition which contains resins with $(CH_2=CH-Si(CH_3)_2O_{1/2})$—, $((CH_3)_3SiO_{1/2})$— and $(SiO_2)$— units, in which the ratio of the sum of $(CH_2=CH-Si(CH_3)_2O_{1/2})$— and $((CH_3)_3SiO_{1/2})$— to $(SiO_2)$— units is 0.6:1 to 1:1.

U.S. Pat. No. 3,436,366 discloses compositions with improved mechanical properties which again contain resins with the structure mentioned above, wherein, however, the ratio of $(CH_2=CH-Si(CH_3)_2O_{1/2})$— and $((CH_3)_3SiO_{1/2})$— units to $(SiO_2)$— units is between 0.5:1 and 1:1.

DE-A-3 423 770 describes transparent membrane structures which are prepared from cross-linkable silicone compositions which contain organopolysiloxane resins with $(CH_2=CH-Si(CH_3)_2O_{1/2})$—, $((CH_3)_3SiO_{1/2})$—, $((CH_3)_2SiO)$— and $(SiO_2)$— units as an essential component, wherein the ratio of $(R_3SiO_{1/2})$— to $(SiO_2)$— units is between 0.5:1 and 1:1, and that of the $(R_2SiO)$— to $(SiO_2)$— units can be in the region of 0.1:1.

All these resins, however are solid products which have to be handled in a suitable solvent, optionally in a silicone polymer. In practice this raises a number of problems with regard to handling. Thus, solvent always has to be removed from the solvent-containing resins before they are used which means additional expenditure. If solid organosiloxane resins are used in polydiorganosiloxane compositions in which a specially low viscosity is required due to the particular application, such as, for example, in mold-making or embedding compositions, an unwanted increase in viscosity results.

The use of liquid polydiorganosiloxane compositions as mold-making and embedding compositions in a variety of fields of application has been known for a long time according to the prior art. In addition to the mechanical properties of the vulcanized elastomers, such as tensile strength, elongation at break and in particular tear resistance, their processing properties also play an important part. Special demands are placed in particular on the reactivity of the compositions and their viscosity. In order to ensure effective processing, particularly low viscosity products are required, but these should also be characterized by good mechanical elastomer properties.

A variety of measures are known for improving the mechanical properties of low viscosity polydiorganosiloxane compositions. Reinforcing fillers such as, for example, pyrogenic silicas are especially important in this connection. Unfortunately, the incorporation of large amounts of these fillers leads to an unwanted increase in viscosity, so this is possible only to a limited extent. Also, the chain-length of the polymer used has a positive effect on the mechanical properties of the products, wherein here again the viscosity increases with an increase in chain-length.

The object of the present invention is to provide liquid organopolysiloxane resins which are suitable for the mechanical reinforcement of silicone elastomers which can be vulcanized using a platinum catalysed hydrosilylation reaction and which lead to low viscosity mixtures with good mechanical properties when used in liquid polydiorganosiloxane compositions.

Surprisingly, it has now been found that organopolysiloxane resins according to the invention, which have a specific proportion of $(R_3SiO_{1/2})$—, $(R_2SiO)$—, $(RO_{1/2})$— and $(SiO_2)$— units, are liquid at room temperature and in addition are especially suitable for the mechanical reinforcement of silicone elastomers, in particular low viscosity polydiorganosiloxane compositions.

Therefore, the present invention provides liquid organopolysiloxane resins with the average composition:

$[R^1Si(CH_3)_2O_{1/2}]_a [(CH_3)_3SiO_{1/2}]_b [R^2O_{1/2}]_c [R^1Si(CH_3)O]_d [(CH_3)_2SiO]_e [SiO_2]$, wherein $R^1$ represents a $C_2$–$C_8$-alkenyl group, preferably a vinyl group, $R^2$ represents optionally substituted, linear or branched $C_1$–$C_8$-alkyl, preferably methyl and/or ethyl groups or mixtures thereof, a+b+c+d+e has a value in the range 1 to 6, preferably between 1 and 3, in particular between 1 and 2, d+e can assume values of 0 to 3, preferably 0.1 to 2, in particular 0.4 to 1, and the resin has a viscosity of 0.1 to 1000 Pas at 25° C., and the alkenyl or vinyl-content of the resin is the range 0.4 to 4 mmol/g, preferably 0.5 to 2.

The present invention also provides a process for preparing the organosiloxane resins according to the invention, by reacting a tetraalkoxysilane and/or its partial hydrolysate with at least one organosiloxane and a strong acid as catalyst in the presence of water and optionally an organic solvent at a temperature >40° C.

Further processing, such as neutralization, filtration and removal of volatile constituents is performed in accordance with the prior art.

The expression tetraalkoxysilane includes all compounds disclosed in the prior art such as, for example, tetra-($C_1$–$C_{18}$)-alkoxysilanes. Tetraethoxysilane, tetramethoxysilane and their partial hydrolysates are preferred.

Organosilanes to be used in the context of the invention may be any known short or long-chain, linear or cyclic siloxane with $C_1$–$C_8$-alkyl and $C_2$–$C_8$-alkenyl groups. Hexamethyldisiloxane, tetramethyldivinyldisiloxane, octamethylcyclotetrasiloxane and tetramethyltetravinylcyclotetrasiloxane are preferred.

Acids for use in the context of the invention are any known strong inorganic acids or strong organic acids. Sulphuric acid and perfluorobutanesulphonic acid are preferred.

Solvents for use in the context of the invention are any known organic solvents. Xylene, hexane and toluene are preferred.

In a particularly preferred embodiment of the invention, the process is performed at temperatures between 80 and 150° C.

The invention provides low-viscosity polydiorganosiloxane compositions containing:

A) at least one liquid organopolysiloxane resin according to the invention with the average composition
[$R^1Si(CH_3)_2O_{1/2}$]$_a$ [$(CH_3)_3SiO_{1/2}$]$_b$ [$R^2O_{1/2}$]$_c$ [$R^1Si(CH_3)O$]$_d$ [$(CH_3)_2SiO$]$_e$ [$SiO_2$],
wherein $R^1$ represents a $C_2$–$C_8$-alkenyl group, preferably a vinyl group, $R^2$ represents an optionally substituted, linear or branched $C_1$–$C_8$-alkyl group, preferably methyl and/or ethyl groups or mixtures thereof, a+b+c+d+e is in the range 1 to 4, preferably between 1 and 3, in particular between 1 and 2, d+e assumes values from 0 to 3, preferably 0 to 2, in particular 0 to 1, and the resin has a viscosity of 0.1 to 1000 Pas at 25° C., and the alkenyl or vinyl content of the resin is in the range 0.4 to 4 mmol/g, preferably 0.5 to 2, B) at least one alkenyl-group-containing polydiorganosiloxane of the formula $R^3$—Si($R^4$)$_2$O—[—Si($R^3$)$_2$O]$_x$—Si($R^4$)$_2R^3$, which is capable of cross-inking, wherein $R^3$ and $R^4$ represent optionally substituted, linear or branched $C_1$–$C_8$-alkyl, preferably methyl, $C_6$–$C_{14}$-aryl, preferably phenyl, or $C_2$–$C_8$-alkenyl, preferably vinyl groups, and x is of a value such that the viscosity of the polymer (B) is 0.1 to 1000 Pas at 25° C., C) at least one liquid polyorganohydrogensiloxane of the general formula
$R^5$—Si($R^6$)$_2$O—[—Si($R^6$)$_2$O]$_n$—[—SiH($R^6$)O]$_m$—Si($R^6$)$_2R^5$, wherein $R^6$ represents optionally substituted, linear or branched $C_1$–$C_8$-alkyl, preferably methyl, $C_6$–$C_{14}$-aryl, preferably phenyl, or $C_2$–$C_8$-alkenyl, preferably vinyl groups, $R^5$ is defined in the same way as $R^6$ or is hydrogen, m is 1 when $R^6$ is H and, when $R^6$ is not H m>2, n and m each independently has a value such that the viscosity of the polymer (C) is about 5 to 10000 mPas at 25° C., D) at least one hydrosilylation catalyst from the group consisting of platinum group metals and their compounds, E) optionally one or more fillers and F) optionally further auxiliary agents such as, for instance, pigments, plasticizers and inhibitors.

Polydiorganosiloxanes B) in the context of the invention are any linear alkenyl group-containing polydimethylsiloxanes capable of cross-linking via a hydrosilylation reaction, known from the prior art, which may contain in addition a small proportion of branched, optionally substituted organylsiloxy units. The vinyl group may be mentioned as a particularly preferred alkenyl group. Preferred polydiorganosiloxanes B) are polydimethylsiloxanes terminally blocked with dimethylvinylsitoxy groups with a viscosity of 0.1 to 1000 Pas at 25° C., preferably 0.1 to 300 Pas.

Liquid polyorganohydrogensiloxanes C) in the context of the invention are preferably low viscosity polymers with an average composition:

$(CH_3)_3SiO$—[—$Si(CH_3)_2O$]$_5$—[—$SiH(CH_3)O$]$_{20}$—Si$(CH_3)_3$, $(CH_3)_3$ SiO—[—$Si(CH_3)_2O$]$_{10}$—[—$SiH(CH_3)O$]$_{30}$—Si$(CH_3)_3$, $(CH_3)_3SiO$—[—$Si(CH_3)_2O$]$_3$—[—$SiH(CH_3)O$]$_{10}$—Si$(CH_3)_3$ or polysiloxanes which contain SiH groups, which contain ($SiO_2$)— and ($RSiO_{3/2}$)— units as other groups.

The concentration of polyorganohydrogensiloxane C) in the cross-linkable polydiorganosiloxane composition is preferably selected so that the molar ratio of hydrogen to alkenyl groups is between 0.5:1 and 10:1. Ratios between 1:1 and 3:1 are particularly preferred.

Hydrosilylation catalysts D) in the context of the invention are any catalysts conventionally used for addition cross-linking systems. Metals from the platinum group, such as e.g. platinum, palladium and rhodium or their compounds are preferred for this purpose. Platinum(0) complexes with vinyl siloxanes as ligands, hexachloroplatinic(IV) acid and their complexes with ethylenically unsaturated compounds such as olefins and vinylsiloxanes are particularly suitable. The platinum concentration in the hydrosilylation catalyst is preferably 0.1 to 500 ppm, with respect to the total mixture of components A) to F), in particular 1 to 250 ppm.

Fillers E) in the context of the invention are reinforcing and non-reinforcing materials. Suitable reinforcing fillers are preferably pyrogenic or precipitated, finely divided silicas with a BET surface area of 50 to 500 m²/g. This type of filler may be surface modified, e.g. with organosilicon compounds. Modification may also be performed during incorporation into the polymer by adding e.g. hexamethyldisilazane or 1,3-divinyl-1,1,3,3-tetramethyldisilazane with the addition of water. Furthermore, materials such as e.g. diatomaceous earths, finely divided quartz powder, amorphous silicas, calcium carbonate, metal oxides, such as aluminum oxide, zinc oxide, titanium dioxide or iron oxide, and carbon black may be used as fillers.

Inhibitors may be mentioned as preferred auxiliary agents F) according to the invention. These compounds may be used to regulate the reactivity of the hydrosilylation reaction. Acetylenic alcohols, such as for example, 2-methylbutyn(3)-ol(2), ethynylcyclohexanol, tetramethylvinylcyclotetrasiloxane or 1,3-divinyl-1,1,3,3-tetramethyldivinyldisiloxane are particularly preferred.

In a preferred embodiment of the present invention, the polydiorganosiloxane compositions according to the invention have the following composition:

100 parts by wt. of A)
20 to 100 parts by wt. of B)
1 to 50 parts by wt. of C)
1 to 250 ppm of D)
0 to 200 parts by wt. of E).

Polydiorganosiloxane compositions according to the invention may be prepared by mixing all the components in any sequence at room temperature. Any known mixing units known from the prior art may be used for this purpose. Examples of these are dissolvers, planetary mixers, butterfly mixers or continuously operating mixing screws. The compositions may optionally be cooled during the course of preparation in order to inhibit premature vulcanization of the material.

In a preferred embodiment, polydiorganosiloxane compositions according to the invention are prepared in the form of two separate components which are homogeneously mixed with each other only immediately prior to application. In this case, one component generally contains the polyorganohydrogensiloxane B) and the second component contains the hydrosilylation catalyst D), separately from each other.

The invention also provides use of the low viscosity polydiorganosiloxane compositions according to the invention as casting and embedding compositions for sealing electronic and electrical components, for producing mold-making and impression compositions and as coating compositions for fabrics and a variety of other materials.

The invention is explained in more detail by the following examples. The invention is not, however, restricted to the examples.

EXAMPLES

Organopolysiloxane Resins (Examples 1 to 4)

Example 1

In a reaction vessel fitted with a stirrer, thermometer, reflux divider, condenser and dropping funnel, 1050 g of a partially hydrolyzed tetraethoxysilane with 40% $SiO_2$, purchased from Huils AG under the name Dynasilan 40, 634 g of hexamethyl-disiloxane, 65.1 g of tetramethyldivinyldisiloxane, 50 g of ethanol and 1000 g of xylene were initially introduced under an atmosphere of nitrogen. To this mixture were added 1 g of conc. sulphuric acid and 0.5 g of perfluorobutanesulphonic acid, the mixture was stirred for one hour at about 100° C. under reflux and 200 g of water were added under reflux over the course of one hour. Stirring was continued for a further 2 hours and the distillate was withdrawn at 1013 hPa at a maximum temperature of the reaction mixture of 100° C. Stirring was continued at 100° C. for a further 4 hours. After neutralizing the reaction mixture with soda/ethanol, it was filtered and volatile compounds were removed from the filtrate for 1 hour at 150° C. and a pressure of <5 hPa. After cooling, a liquid, clear, colorless to pale yellow product with 0.6 mmol vinyl/g and a viscosity of ca. 5 Pas was obtained. From the $^1H$ and $^{29}Si$- NMR spectra of the product, the product had an average composition of

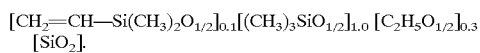
$[CH_2=CH-Si(CH_3)_2O_{1/2}]_{0.1}[(CH_3)_3SiO_{1/2}]_{1.0}[C_2H_5O_{1/2}]_{0.3}[SiO_2]$.

Example 2

1000 g of partially hydrolyzed tetraethoxysilane with 40% $SiO_2$, 562 g of hexamethyldisiloxane and 98 g of tetramethyldivinyldisiloxane in 1061 g of xylene were reacted with 1 g of sulphuric acid and 0.5 g of perfluorobutanesulphonic acid in accordance with Example 1. A liquid, clear, colorless to pale yellow product with 0.9 mmol vinyl/g and a viscosity of ca. 1.8 Pas was obtained. The average composition, from $^1H$ and $^{29}Si$ NMR spectra, was

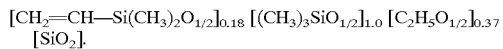
$[CH_2=CH-Si(CH_3)_2O_{1/2}]_{0.18}[(CH_3)_3SiO_{1/2}]_{1.0}[C_2H_5O_{1/2}]_{0.37}[SiO_2]$.

Example 3

839 g of partially hydrolyzed tetraethoxysilane with 40% $SiO_2$, 205 g of octamethyl-cyclotetrasiloxane, 459 g of hexamethyldisiloxane, 91 g of tetramethyldivinyldisiloxane, 50 g of ethanol and 272 g of xylene were reacted with 1 g of sulphuric acid and 0.5 g of perfluorobutanesulphonic acid in the same way as in Example 1. A liquid, clear, colorless to pale yellow product with 0.8 mmol of vinyl/g and a viscosity of ca. 3.5 Pas was obtained. The average composition, from $^1H$ and $^{29}Si$ NMR spectra, was

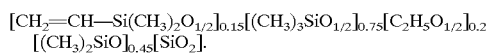
$[CH_2=CH-Si(CH_3)_2O_{1/2}]_{0.15}[(CH_3)_3SiO_{1/2}]_{0.75}[C_2H_5O_{1/2}]_{0.2}[(CH_3)_2SiO]_{0.45}[SiO_2]$.

Example 4

887 g of partially hydrolyzed tetraethoxysilane with 40% $SiO_2$, 205 g of octamethyl-cyclotetrasiloxane, 479 g of hexamethyldisiloxane, and 265 g of tetramethyltetravinylcyclotetrasiloxane in 1000 g of xylene were reacted with 1 g of sulphuric acid and 0.5 g of perfluorobutanesulphonic acid in the same way as in Example 1. A clear, colorless to pale yellow liquid with 1.7 mmol of vinyl/g and a viscosity of ca. 870 mPas was obtained. The average composition, from $^1H$ and $^{29}Si$ NMR spectra, was

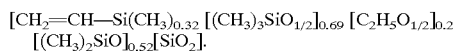
$[CH_2=CH-Si(CH_3)_{0.32}[(CH_3)_3SiO_{1/2}]_{0.69}[C_2H_5O_{1/2}]_{0.2}[(CH_3)_2SiO]_{0.52}[SiO_2]$.

Cross-linkable Polydiorganosiloxane Compositions (Examples 5 to 11)

These examples demonstrate the use of organopolysiloxane resins according to the invention in cross-linkable polydiorganosiloxane compositions. For this, homogeneous mixtures were prepared from the constituents specified below, the compositions being given in Table 1:

1) Polydimethylsiloxane blocked with terminal dimethylvinylsiloxy groups with a viscosity of 65 Pas at 25° C.,
2a) Organopolysiloxane resin from Example 1,
2b) Organopolysiloxane resin from Example 2,
2c) Organopolysiloxane resin from Example 3,
2d) Solid organopolysiloxane resin with $(CH_2=CH-Si(CH_3)_2O_{1/2})-$, $((CH_3)_3SiO_{1/2})-$, $((CH_3)_2SiO)-$ and $(SiO_2)-$ units and a vinyl content of 0.7 mmol/g,
2e) Organopolysiloxane resin from Example 4,
3) Polyorganohydrogensiloxane with a SiH- content of 8.3 mmol/g, which is essentially built up from $(SiO_2)-$ and $((CH_3)_2HSiO_{1/2})-$ units,
4) Milled quartz powder with an average particle size of 3 μm
5) Platinum catalyst in the form of a Pt(0) complex in tetramethylvinyltetracyclosiloxane with 2% platinum,
6) Tetramethylvinyltetracyclosiloxane as inhibitor,
7) Blue coloring paste.

After preparing the mixture, the viscosity of the compositions was first determined. The viscosity was measured with a cone plate viscometer from the Physica Co. Then the compositions were poured into 2 mm deep plates, compressed and vulcanized at 175° C. for 10 minutes. The mechanical properties of the cured elastomer plates with a thickness of about 2 mm were then tested. For this purpose, specimens were cut from the material in accordance with the DIN or ASTM instructions quoted (see Table 2) and tested.

TABLE 1

Compositions of the mixtures.

| Constituent [parts by wt.] | 5.* | 6. | 7. | 8. | 9. | 10. | 11. |
|---|---|---|---|---|---|---|---|
| 1) | 75 | 70 | 60 | 75 | 75 | 75 | 70 |
| 2a) | 0 | 30 | 40 | 0 | 0 | 0 | 0 |
| 2b) | 0 | 0 | 0 | 25 | 0 | 0 | 0 |
| 2c) | 0 | 0 | 0 | 0 | 0 | 25 | 30 |
| 2d) | 25 | 0 | 0 | 0 | 0 | 0 | 0 |
| 2e) | 0 | 0 | 0 | 0 | 25 | 0 | 0 |
| 3) | 7.3 | 7.6 | 7.6 | 8.9 | 12.3 | 6.3 | 7.3 |
| 4) | 40 | 40 | 40 | 40 | 40 | 40 | 40 |
| 5) | 0.13 | 0.13 | 0.13 | 0.13 | 0.13 | 0.13 | 0.13 |
| 6) | 0.13 | 0.13 | 0.13 | 0.13 | 0.13 | 0.13 | 0.13 |
| 7) | 1.35 | 1.35 | 1.35 | 1.35 | 1.35 | 1.35 | 1.35 |

*Comparison example

TABLE 2

Mechanical properties of the vulcanized polydiorganosiloxane compositions.

| Example no./Property | 5.* | 6. | 7. | 8. | 9. | 10. | 11. |
|---|---|---|---|---|---|---|---|
| Viscosity [Pas] | 74 | 42 | 31 | 50 | 52 | 59 | 51 |
| Hardness [Shore A] (DIN 53505) | 52 | 42 | 54 | 46 | 67 | 49 | 54 |
| Elongation at break [%] (DIN 53504) | 170 | 280 | 240 | 270 | 190 | 290 | 340 |
| Tensile strength [MPa] (DIN 53504) | 4.5 | 4.8 | 5.2 | 5.8 | 6.1 | 5.3 | 5.1 |
| Tensile strength at 100% extension [MPa] (DIN 53504) | 3.3 | 2.1 | 3.6 | 2.9 | 4.6 | 2.6 | 2.8 |
| Tear resistance [N/mm] (ASTM 624 B) | 11 | 10 | 16 | 11 | 10 | 9 | 11 |
| Tear resistance [N/mm] (DIN 53515) | 5 | 4 | 6 | 4 | 4 | 3 | 4 |

*Comparison example

Comments Relating to Examples 5 to 11

In comparison Example 5 a solid organopolysiloxane resin was used like the ones known from the literature. This test thus represented an example according to the prior art. As can be seen by comparing the results of Examples 6 to 11 with Example 5, the liquid organopolysiloxane resins according to the invention also served to reinforce the mechanical properties of the elastomers. Here, however, the non-vulcanized compositions had much lower viscosities and also therefore better processing properties, than composition 5 with the solid resin. The results also prove that the mechanical elastomer properties can be controlled and adjusted by varying the concentration of liquid resin in the composition and also via the number of vinyl groups in the resin. Liquid organopolysiloxane resins according to the invention are thus extremely suitable for reinforcing cross-linkable polydiorganosiloxane compositions.

It will be understood that the specification and examples are illustrative but not limitative of the present invention and that other embodiments within the spirit and scope of the invention will suggest themselves to those skilled in the art.

We claim:

1. A low viscosity polydiorganosiloxane composition consisting essentially of

A) at least one liquid organopolysiloxane resin with the average composition

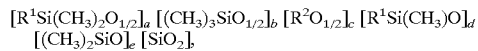

wherein $R^1$ is a $C_2$–$C_8$-alkenyl group, $R_2$ is an optionally substituted, linear or branched $C_1$–$C_8$-alkyl group or a mixture thereof, a+b+c+d+e is about 1 to 6, d+e is about 0 to 3, the resin has a viscosity of 0.1 to 1000 Pas at 25° C., and the alkenyl content of the resin is in the range of 0.4 to 4 mmol/g, B) at least one alkenyl-group-containing polydiorganosiloxane which is capable of cross-linking, of the formula

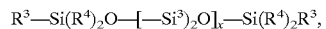

wherein $R_3$ and $R^4$ each represent optionally substituted, linear or branched $C_1$–$C_8$-alkyl, $C_6$–$C_{14}$-aryl, or $C_2$–$C_8$-alkenyl, x has a value which causes the viscosity of the resulting polymers (B) to be in the range of from 0.1 to 1000 Pas at 25° C., C) at least one liquid polyorganohydrogensiloxane of the general formula

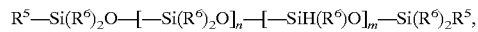

wherein $R^6$ is an optionally substituted, linear or branched $C_1$–$C_8$-alkyl group, $R^5$ has the same meaning as $R^6$, or is hydrogen, n and m each independently have a value which cause the viscosity of the resulting polymer (C) to be about 5 to 10000 mpas at 25° C., or a polysiloxane which contains SiH groups, $(SiO_2)$— groups, and $(RSiO_{3/2})$— groups, wherein R represents an organo group, D) at least one hydrosilylation catalyst from the group consisting of platinum group metals and their compounds, E) optionally one or more fillers, and F) optionally at least one further auxiliary agent.

2. A low viscosity polydiorganosiloxane composition according to claim 1, wherein B) is blocked with dimethylvinylsiloxy groups and has a viscosity of 0.1 to 300 Pas at 25° C.

3. A low viscosity polydiorganosiloxane composition according to claim 1, wherein C) is at least one member selected from the group consisting of

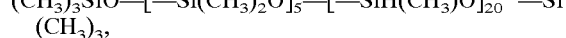

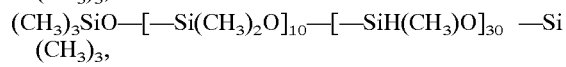

(CH₃)₃SiO—[—Si(CH₃)₂O]₃—[—SiH(CH₃)O]₁₀—Si(CH₃)₃, and a polysiloxane which contain SiH groups, SiO₂ groups and RSiO$_{3/2}$ groups, wherein R represents an organo group.

4. A low viscosity polydiorganosiloxane composition according to claim 1, wherein in (C) the molar ratio of hydrogen to alkenyl groups is between 1:1 and 3:1.

5. A low viscosity polydiorganosiloxane composition according to claim 1, wherein the hydrosilylation catalyst is selected from the group consisting of a platinum(0) complex with a vinylsiloxane as ligand, hexachloroplatinic(IV) acid, and a complex thereof with an ethylenically unsaturated compound.

6. A low viscosity polydiorganosiloxane composition according to claim 5, wherein the platinum concentration in the hydrosilylation catalyst is 0.1 to 500 ppm of platinum, with respect to the total minute of components (A) to (F).

7. A low viscosity polydiorganosiloxane composition according claim 1, wherein a filler (E) is present and is optionally surface-modified with at least one member selected from the group consisting of a pyrogenic or precipitated finely divided silica with a BET surface area of 50 to 500 m²/g, diatomaceous earth, finely divided quartz powder, amorphous silica, calcium carbonate, a metal oxide and carbon black.

8. A low viscosity polydiorganosiloxane composition according to claim 1, wherein at least one auxiliary agent (F) is present and is selected from the group consisting of 2-methyl-butyn(3)-ol-(2), ethynylocyclohexanol, tetramethylvinylcyclotetrasiloxane and 1,3-divinyl-1,1,3,3-tetramethyldivinyldisiloxane.

9. A low viscosity polydiorganosiloxane composition according to claim 1, containing 100 parts by wt. of A)

20 to 100 parts by wt. of B)

1 to 50 parts by wt. of C)

1 to 250 ppm of D), and 0 to 200 parts by wt. of E).

10. A low viscosity polydiorganosiloxane composition according to claim 3, wherein (B) is a polydimethylsiloxane terminally blocked with dimethylvinylsiloxy groups with a viscosity of 0.1 to 300 Pas at 25° C., (C) the molar ratio of hydrogen to alkenyl groups is between 1:1 and 3:1.

(D) the hydrosilylation catalyst is selected from the group consisting of a platinum(0) complex with a vinylsiloxane as ligand, hexachloroplatinic(IV) acid, and a complex thereof with an ethylenically unsaturated compound, and the platinum concentration in the hydrosilylation catalyst is 0.1 to 500 ppm of platinum, with respect to the total mixture of components (A) to (F), (E) a filler is present and is optionally surface-modified with at least one member selected from the group consisting of a pyrogenic or precipitated finely divided silica with a BET surface area of 50 to 500 m²/g, diatomaceous earth, finely divided quartz powder, amorphous silica, calcium carbonate, a metal oxide and carbon black, and (F) at least one auxiliary agent is present and is selected from the group consisting of 2-methyl-butyn(3)-ol-(2), ethynylocyclohexanol, tetramethylvinylcyclotetrasiloxane and 1,3-divinyl-1,1,3,3-tetramethyldivinyldisiloxane, the composition containing about, 100 parts by wt. of (A)

20 to 100 parts by wt. of (B)

1 to 50 parts by wt. of (C)

1 to 250 ppm of (D), and 0 to 200 parts by wt. of (E).

11. An elastomer produced by vulcanizing a composition according to claim 1.

12. In the casting or embedding of an electronic or electrical components in the preparation of a mold or impression, or in the coating of a fabric by employing a liquid organopolysiloxane composition, the improvement which comprises employing as said composition a low viscosity polydiorganosiloxane composition according to claim 1.

* * * * *